United States Patent
Ho et al.

(10) Patent No.: US 9,042,416 B1
(45) Date of Patent: May 26, 2015

(54) HIGH-POWER LOW-LOSS GRINSCH LASER

(71) Applicant: Corning Incorporated, Corning, NY (US)

(72) Inventors: Chin-Kuo Ho, Taipei (TW); Martin Hai Hu, Painted Post, NY (US); Yabo Li, Acton, MA (US); Shiwen Liu, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 104 days.

(21) Appl. No.: 13/837,270

(22) Filed: Mar. 15, 2013

Related U.S. Application Data

(60) Provisional application No. 61/773,316, filed on Mar. 6, 2013.

(51) Int. Cl.
*H01S 5/00* (2006.01)
*H01S 5/34* (2006.01)

(52) U.S. Cl.
CPC .............. *H01S 5/3409* (2013.01); *H01S 5/34* (2013.01)

(58) Field of Classification Search
CPC .................................................... H01S 5/3409
USPC .................................................... 372/45.01
See application file for complete search history.

(56) References Cited

U.S. PATENT DOCUMENTS

| | | | |
|---|---|---|---|
| 4,745,612 A | 5/1988 | Hayakawa et al. | |
| 4,905,246 A | 2/1990 | Hayakawa et al. | |
| 5,010,374 A * | 4/1991 | Cooke et al. | 372/45.01 |
| 5,075,743 A | 12/1991 | Behfar-Rad | |
| 5,189,679 A * | 2/1993 | Derry et al. | 372/45.011 |
| 5,307,361 A * | 4/1994 | Kahen et al. | 372/46.012 |
| 5,349,596 A | 9/1994 | Molva et al. | |
| 5,438,585 A * | 8/1995 | Armour et al. | 372/45.01 |
| 6,078,602 A | 6/2000 | Sato | |
| 6,304,587 B1 * | 10/2001 | Zah | 372/46.01 |
| 6,618,412 B2 * | 9/2003 | Shigihara | 372/45.01 |
| 7,129,512 B2 * | 10/2006 | Shigihara | 257/9 |
| 2001/0009558 A1 | 7/2001 | Shigihara | |
| 2011/0274130 A1* | 11/2011 | Abeles et al. | 372/45.01 |
| 2012/0076165 A1* | 3/2012 | Chakraborty et al. | 372/45.01 |
| 2012/0250717 A1 | 10/2012 | Lauer | |

FOREIGN PATENT DOCUMENTS

WO   2012097947   7/2012

OTHER PUBLICATIONS

V. Gapontsev, N. Moshegov, P. Trubenko, A. Komissarov, I. Berishev, N. Strougov, V. Chuyanov, and A. Ovtchinnikov, "High Brightness 975nm Pumps with Ultra-Stable Wavelength Stabilization," Proc. of SPIE vol. 8241 82410O-1, 2012.

V. Gapontsev, I. Berishev, G. Ellis, A. Komissarov, N. Moshegov, O. Raisky, P. Trubenko, V. Ackermann, E. Shcherbakov, J. Steinecke, and A. Ovtchinnikov, "High-efficiency 970 nm multimode pumps," Proc. of SPIE vol. 5711, 2005.

(Continued)

*Primary Examiner* — Colleen A Matthews
*Assistant Examiner* — Vu A Vu
(74) *Attorney, Agent, or Firm* — Svetlana Short

(57) ABSTRACT

A GRINSCH laser having an asymmetric configuration wherein the optical confinement is weighted more to the n-doped multilayer section than to the p-doped multilayer section. The GRINSCH laser can emit laser light at a wavelength $\lambda=976$ nm over a broad area with a beam power of 11.4 W at a 12 A bias current at a temperature of 20° C. Fabry-Perot and distributed Bragg reflector GRINSCH laser configurations are disclosed.

17 Claims, 16 Drawing Sheets

(56) References Cited

OTHER PUBLICATIONS

Matthew Peters, Victor Rossin, Matthew Everett and Erik Zucker, "High Power, High Efficiency Laser Diodes at JDSU," Proc. of SPIE vol. 6456 64560G, 2007.

Ling Bao, Jun Wang, Mark DeVito, Dapeng Xu, Damian Wise, Paul Leisher, Mike Grimshaw, Weimin Dong, Shiguo Zhang, Kirk Price, Darning Li, Chendong Bai, Steve Patterson, and Rob Martinsen, "Reliability of High Performance 9xx-nm Single Emitter Diode Lasers," Proc. of SPIE vol. 7583 758302, 2010.

* cited by examiner

HIGH-POWER LOW-LOSS GRINSCH LASER

CLAIM OF PRIORITY

This application claims the benefit of priority under 35 U.S.C. §119(e) of U.S. Provisional Application Ser. No. 61/773,316, filed on Mar. 6, 2013, and which is incorporated by reference herein.

FIELD

This disclosure is related to lasers, and in particular relates to a high-power, low-loss gradient-index separate-confinement heterostructure (GRINSCH) laser.

BACKGROUND ART

Semiconductor lasers are widely used as pumping sources for solid-state lasers, fiber lasers and light sources for direct-diode systems. These laser systems are increasingly being deployed into material processing, medical and electronics markets and applications.

Semiconductor lasers are generally formed from layers of doped semiconductor materials that define an active layer and surrounding cladding layers. Conventional semiconductor lasers have an abrupt transition between the active and cladding layers, which defines an abrupt change in the band gap between the materials. One newer type of semiconductor laser is called a high-power, low-loss gradient-index separate-confinement heterostructure or "GRINSCH" laser. GRINSCH lasers have layers where the doping changes gradually so that the band gap changes gradually. This generally results in greater efficiency as compared to conventional semiconductor lasers.

Yet, there is an ongoing need for GRINSCH lasers that have reduced waveguide loss and reduced carrier leakage.

SUMMARY

An aspect of the disclosure is a GRINSCH laser having an asymmetric configuration wherein the optical confinement is weighted more to the n-doped multilayer section than to the p-doped multilayer section. The GRINSCH laser can emit laser light at a wavelength λ=976 nm over a broad area with a beam power of 11.4 W at a 12 A bias current and 20° C. heat sink temperature. Embodiments include Fabry-Perot (FP) and distributed Bragg reflector (DBR) GRINSCH laser configurations.

Another aspect of the disclosure is a GRINSCH laser having: a lasing layer comprising a quantum-well structure; an n-doped multilayer section having a first thickness T1; a p-doped multilayer section having second thickness T2; wherein the p-doped and n-doped multilayer sections sandwich the lasing layer; and wherein the first and second thicknesses T1 and T2 define a thickness ratio $R_T = T1/T2$, and wherein $2 \leq R_T \leq 8$.

Another aspect of the disclosure is a GRINSCH laser as described above, wherein $5.5 \leq R_T \leq 6.5$.

Another aspect of the disclosure is a GRINSCH laser as described above, wherein T1 is in the range: 350 nm $\leq$ T1 $\leq$ 650 nm.

Another aspect of the disclosure is a GRINSCH laser as described above, wherein T1 is in the range: 400 nm $\leq$ T1 $\leq$ 600 nm.

Another aspect of the disclosure is a GRINSCH laser as described above, wherein the n-doped multilayer section and the p-doped multilayer section each has a doping level of no greater than $1 \times 10^{17}/cm^3$.

Another aspect of the disclosure is a GRINSCH laser as described above, wherein the n-doped multilayer section and the p-doped multilayer section each has a doping level of no greater than $1 \times 10^{16}/cm^3$.

Another aspect of the disclosure is a GRINSCH laser as described above, further comprising a confinement factor of greater than 1%.

Another aspect of the disclosure is a GRINSCH laser as described above, further comprising a vertical far-field angle of less than 30 degrees.

Another aspect of the disclosure is a GRINSCH laser as described above, further comprising an AlGaAs sub-cladding layer having a thickness T3 in the range 0.25 micron $\leq$ T3 $\leq$ 0.75 micron.

Another aspect of the disclosure is a GRINSCH laser as described above, wherein 0.25 micron $\leq$ T3 $\leq$ 0.6 micron.

Another aspect of the disclosure is a GRINSCH laser as described above, wherein AlGaAs sub-cladding layer has an atom fraction of Aluminum in the range from 0.20 to 0.26.

Another aspect of the disclosure is a GRINSCH laser as described above, further comprising a quantum well barrier layer that resides between the quantum well layer and the p-doped multilayer section, wherein the quantum well barrier layer contains AlGaAs with an atom fraction of Aluminum in the range from 6% to 13%.

Another aspect of the disclosure is a GRINSCH laser as described above, wherein the atom fraction of Aluminum is in the range from 8% to 13%.

Another aspect of the disclosure is a GRINSCH laser as described above and having a power of 11.4 W at a 12 A bias current at a temperature of 20° C., which in an example is established through the use of a heat sink.

Another aspect of the disclosure is a GRINSCH laser as described above and having a laser cavity that is longer than 4 mm.

It is to be understood that both the foregoing general description and the following Detailed Description represent embodiments of the disclosure, and are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure and together with the description serve to explain the principles and operations of the disclosure.

Additional features and advantages of the disclosure are set forth in the detailed description that follows, and in part will be readily apparent to those skilled in the art from that description or recognized by practicing the disclosure as described herein, including the detailed description that follows, the claims, and the appended drawings.

The claims as set forth below are incorporated into and constitute part of the Detailed Description set forth below.

Additional features and advantages of the disclosure are set forth in the Detailed Description that follows and will be apparent to those skilled in the art from the description or recognized by practicing the disclosure as described herein, together with the claims and appended drawings.

Cartesian coordinates are shown in certain of the Figures for the sake of reference and are not intended as limiting with respect to direction or orientation.

DETAILED DESCRIPTION

Figure 1A:
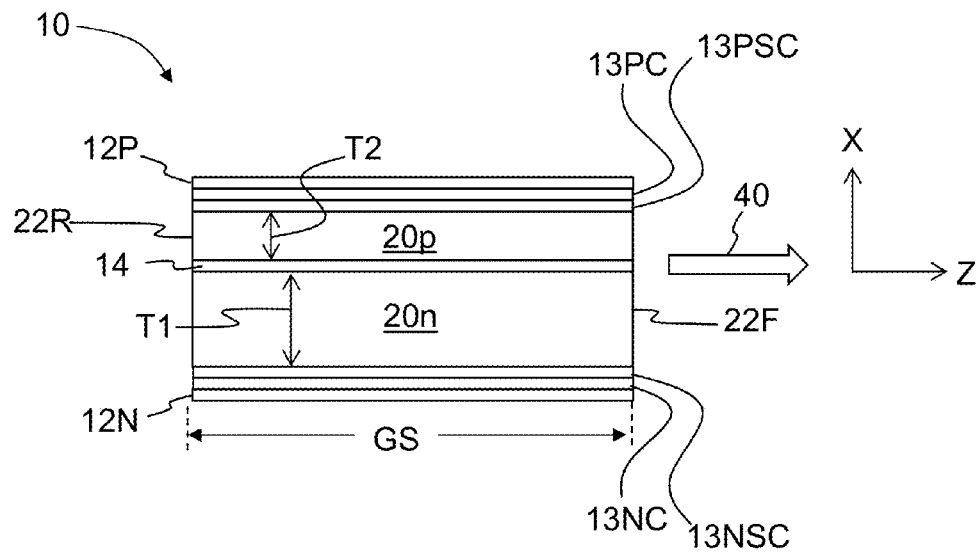
FIG. 1A is a schematic diagram of an example Fabry-Perot (FP) GRINSCH laser as disclosed herein.
Figure 1B:
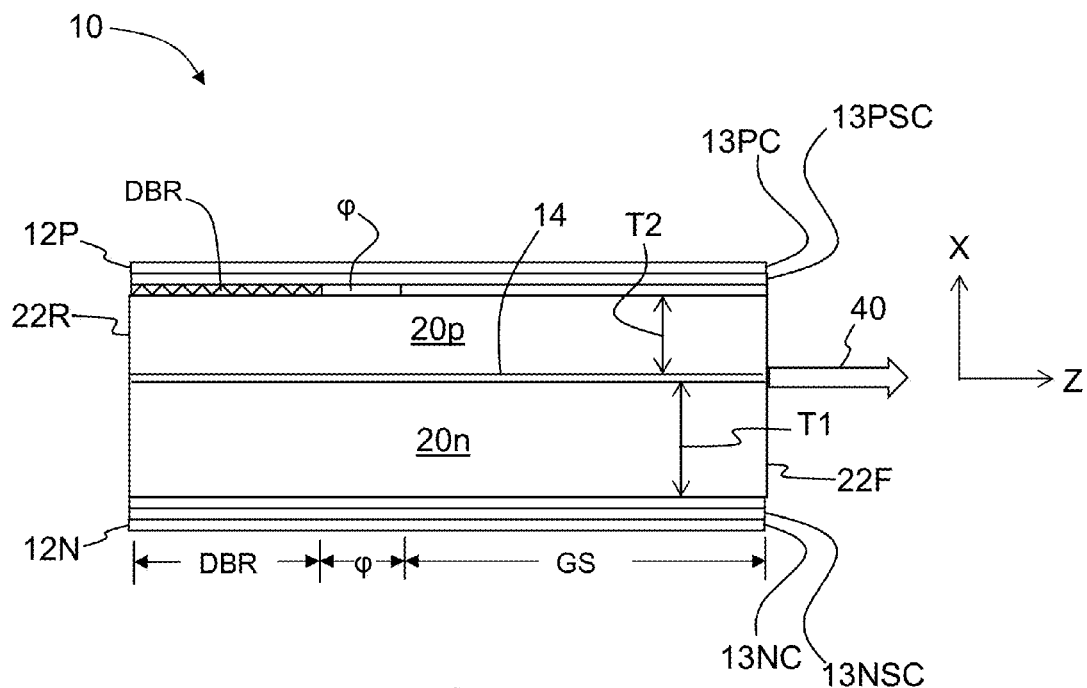
FIG. 1B is a schematic diagram of an example distributed Bragg reflector (DBR) GRINSCH laser as disclosed herein.

FIGS. 1A and 1B are schematic diagrams of different basic configurations of an example GRINSCH laser 10 as disclosed herein. The GRINSCH laser 10 of FIG. 1A has a Fabry-Perot (FP) configuration, while the GRINSCH laser 10 of FIG. 1B has a distributed Bragg reflector (DBR) configuration. GRINSCH laser 10 has a laser wavelength λ that can be in the range from 900 to 999 nm, e.g., at a nominal wavelength λ=976 nm. The laser wavelength λ is thus usually denoted as "9xx."

The FP GRINSCH laser 10 of FIG. 1A includes in order from bottom to top: a n-contact layer 12N, an n-cladding layer 13NC, an n-sub-cladding layer 13NSC an n-doped multilayer section 20n (also called the "n-GRINSCH"), a lasing layer 14, a p-doped multilayer section 20p (also called the "p-GRINSCH"), a p-sub-cladding layer 13PSC, a p-cladding layer 13PC, and a p-contact layer 12P. GRINSCH laser 10 also includes front and rear facets 22F and 22R that define a gain section GS that extends between the facets. GRISNCH laser 10 is configured to emit laser light 40 having the aforementioned wavelength λ.

With reference to FIG. 1B, DBR GRINSCH laser 10 is similar to the FP GRINSCH laser of FIG. 1A and includes a DBR section ("DBR") and an optional phase section φ.

Figure 2A:
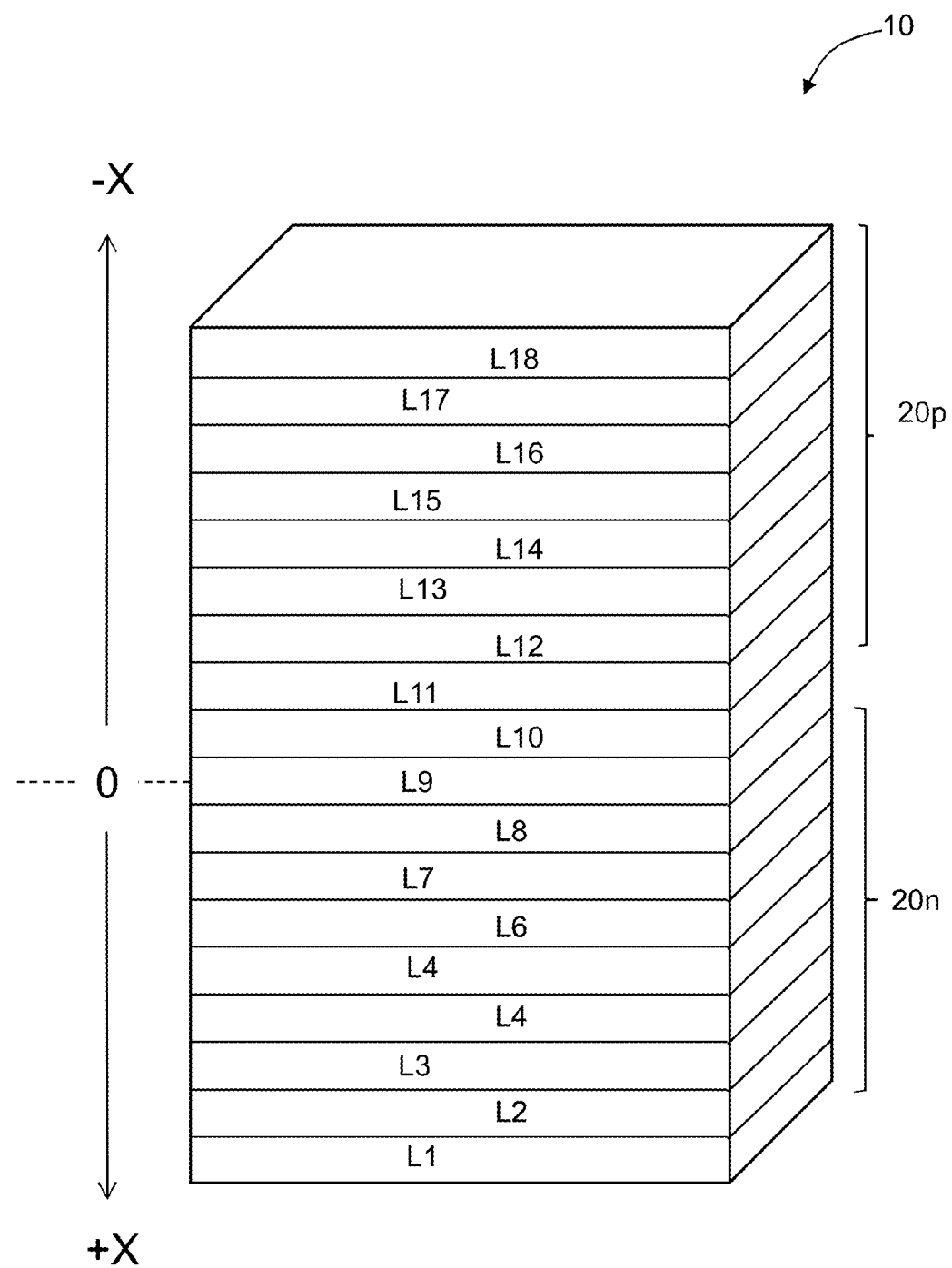
FIGS. 2A and 2B are schematic diagrams of the layered structure of example prior art GRINSCH lasers.

FIG. 2A is a schematic diagram of the layered structure of an example GRINSCH laser 10 that is constituted by layers L1 through L20. Table 1 below describes the general layers L1 through L20 of a prior art GRINSCH laser, starting at the top of the Table with the topmost layer L20 and proceeding downward to the bottom-most layer L1 at the bottom of the Table.

TABLE 1

| General Layers L1 through L18 | |
|---|---|
| LAYER | DESCRIPTION |
| L18 | p metal contact layer: $p^{++}$-GaAs |
| L17 | Graded $p^+$-GaAs |
| L16 | Graded $p^+$-AlGaAs |
| L15 | $p^+$-AlGaAs |
| L14 | Ridge stop layer |
| L13 | $p^+$-AlGaAs |
| L12 | Grating Layer (optional) |
| L11 | $p^+$-AlGaAs |
| L10 | Graded AlGaAs |
| L9 | QW Barrier Layer |
| L8 | Lasing layer: Quantum well (QW) of In GaAs |
| L7 | QW Barrier Layer |
| L6 | Graded AlGaAs |
| L5 | n-AlGaAs |
| L4 | Graded $n^+$-AlGaAs |
| L3 | Buffer Layer of $n^+$-GaAs |
| L2 | $n^+$-GaAs Substrate |
| L1 | n metal contact layer |

Layers L3 through L6 constitute n-doped multilayer section 20n and layers L10 through L17 constitute p-doped multilayer section 20p. Layer L1 is the n metal contact 12N and layer 18 is the p metal contact 12P. The quantum well L8 corresponds to laser layer 14 in FIGS. 1A and 1B. The quantum well L8 is sandwiched by barrier layers L7 and L9.

Prior Art Symmetrical GRINSCH Laser Example

Figure 2B:
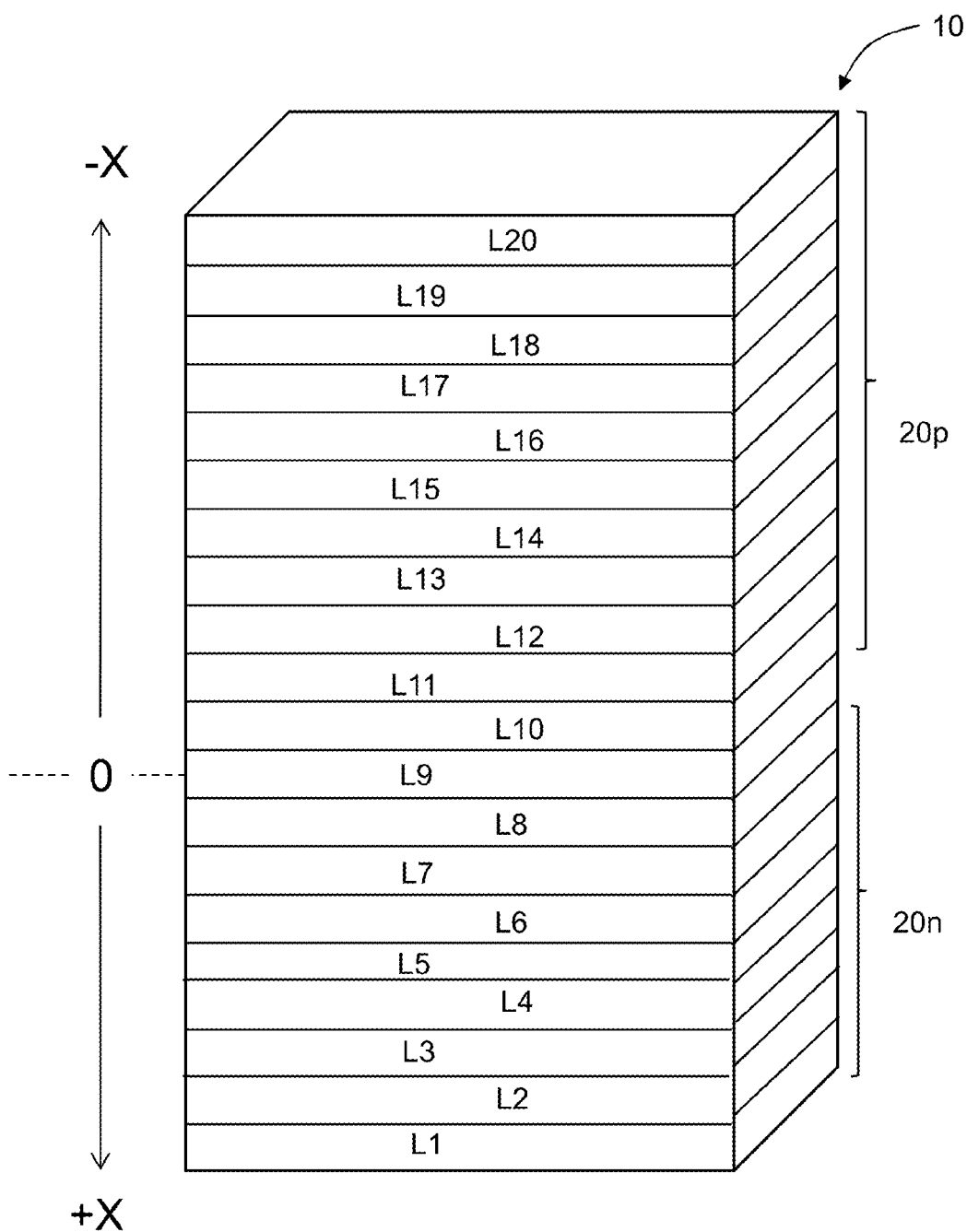

Table 2 below sets forth the specific layer parameters associated with an example prior art configuration of GRINSCH laser 10. FIG. 2B is representative of the general layered structure of the FP GRINSCH laser 10 of Table 2. The notation (X→Y) in the "Doping" column indicates the doping gradient over the particular layer.

TABLE 2

PRIOR ART GRINSCH LASER PARAMETERS

| LAYER | DESCRIPTION | TH | DOPING (cm$^{-3}$) |
|---|---|---|---|
| L20 | p contact: P$^{++}$-GaAs | 50 nm | $1.1 \times 10^{20}$ |
| L19 | p$^+$-GaAs | 50 nm | $(1 \rightarrow 11) \times 10^{19}$ |
| L18 | p$^+$-Al$_{0.28}$GaAs $\rightarrow$ P$^+$-GaAs | 50 nm | $(1 \rightarrow 10) \times 10^{18}$ |
| L17 | p$^+$-Al$_{0.28}$GaAs | 800 nm | $8 \times 10^{17}$ |
| L16 | p$^+$-Al$_{0.28}$GaAs | 300 nm | $(5 \rightarrow 8) \times 10^{17}$ |
| L15 | p+-Al$_{0.6}$Ga$_{0.4}$As | 5 nm | $10 \times 10^{17}$ |
| L14 | p-Al$_{0.28}$GaAs | 350 nm | $(3 \rightarrow 5) \times 10^{17}$ |
| L13 | P$^+$-Al$_{0.28}$GaAs | 5 nm | $3 \times 10^{17}$ |
| L12 | p-Al$_{0.28}$GaAs | 45 nm | $2 \times 10^{17}$ |
| L11 | p-Al$_{0.15}$GaAs $\rightarrow$ p-Al$_{0.28}$GaAs | 91 nm | $(0.5 \rightarrow 2) \times 10^{17}$ |
| L10 | Al$_{0.08}$GaAs $\rightarrow$ Al$_{0.15}$GaAs | 49 nm | |
| L9 | IN$_{.18}$Ga$_{.72}$As | 7.5 nm | |
| L8 | Al$_{0.15}$GaAs $\rightarrow$ Al$_{0.08}$GaAs | 49 nm | |
| L7 | n-Al$_{0.28}$GaAs $\rightarrow$ n-Al$_{0.15}$GaAs | 91 nm | $5 \times 10^{16}$ |
| L6 | n-Al$_{0.28}$GaAs | 90 nm | $(4 \rightarrow 1) \times 10^{17}$ |
| L5 | n$^+$-Al$_Y$GaAs $\rightarrow$ n+-Al$_{0.28}$GaAs | 20 mm | $4 \times 10^{17}$ |
| L4 | n$^+$-Al$_Y$GaAs | 5000 nm | $4 \times 10^{17}$ |
| L3 | n$^+$-GaAs $\rightarrow$ n$^+$-Al$_Y$GaAs | 150 nm | $(3 \rightarrow 1) \times 10^{18}$ |
| L2 | n$^+$-GaAs | 750 nm | $3 \times 10^{18}$ |
| L1 | N metal Contact: n$^+$-GaAs | | |

In an example, layers L6 and L14 have photoluminescent center wavelengths $\lambda_{PL}$ of 700 nm, while lasing layer L9 has a photoluminescent center wavelength of 960 nm.

Figure 3A:
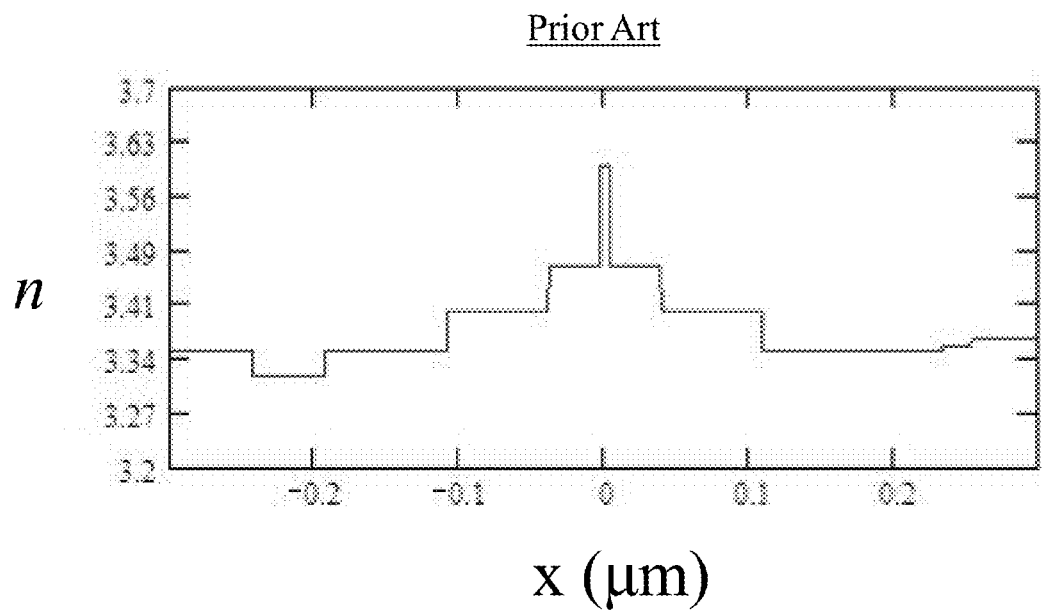
FIG. 3A is a plot of the refractive index n versus the position x (μm) for the prior art GRINSCH laser as set forth in Table 2.
Figure 3B:
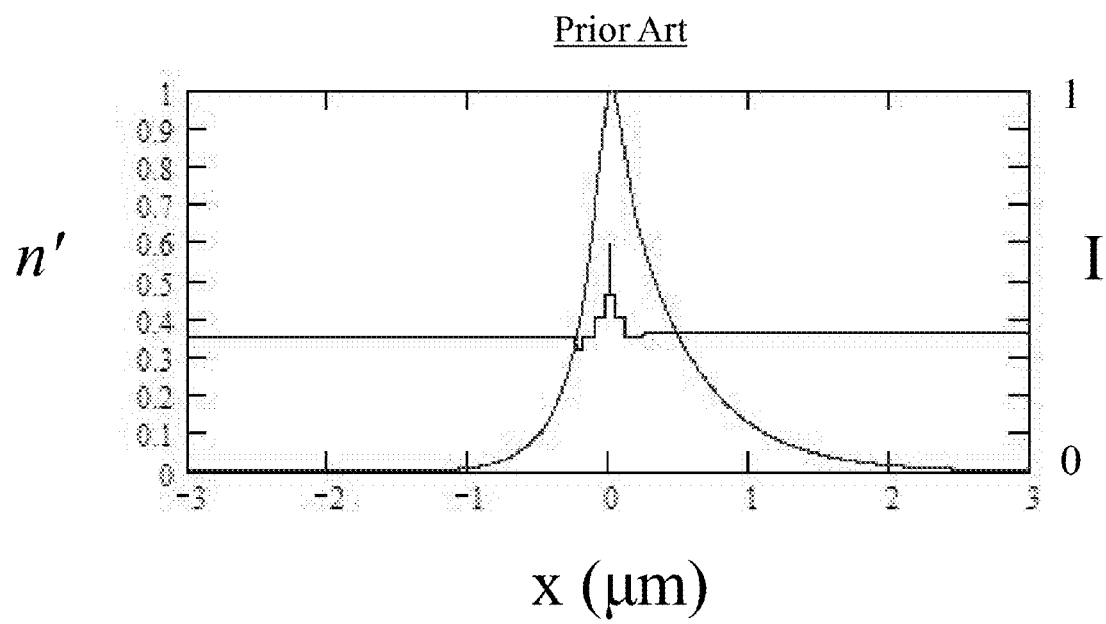
FIG. 3B is a plot of the adjusted refractive index n' and the intensity distribution of the laser beam as a function of position x (μm) for the prior art GRINSCH laser as set forth in Table 2.

FIG. 3A is a plot of the layer refractive index n versus position X (in microns or μm) showing the relatively symmetric refractive index profile of the GRINSCH laser of Table 2B about the lasing layer L9, which is centered at X=0. FIG. 3B is a plot of the (adjusted) refractive index n'=n−3 and the normalized intensity I as a function of the X coordinate. The GRINSCH laser of Table 2 has a (976L28Y, Y=25) configuration. The intensity plot indicates that the light 40 emitted by the GRINSCH laser 10 travels in substantially the same amounts in the n-section 20p and the n-section 20n. However, for a given carrier concentration, the optical loss due to a hole is about three times that due to an electron, so that this distribution of light 40 is not optimal.

Accordingly, it would be beneficial to have more of the light 40 travel in the N-doped multilayer section 20n, and in particular, travel mostly in the low doped n-GRINSCH region) rather than in the p-doped multilayer section 20p. Moreover, it would be beneficial to reduce the carrier leakage at high temperature by increasing the barrier height of the quantum well that constitutes lasing layer L9.

FP GRINSCH Laser

Figure 2C:
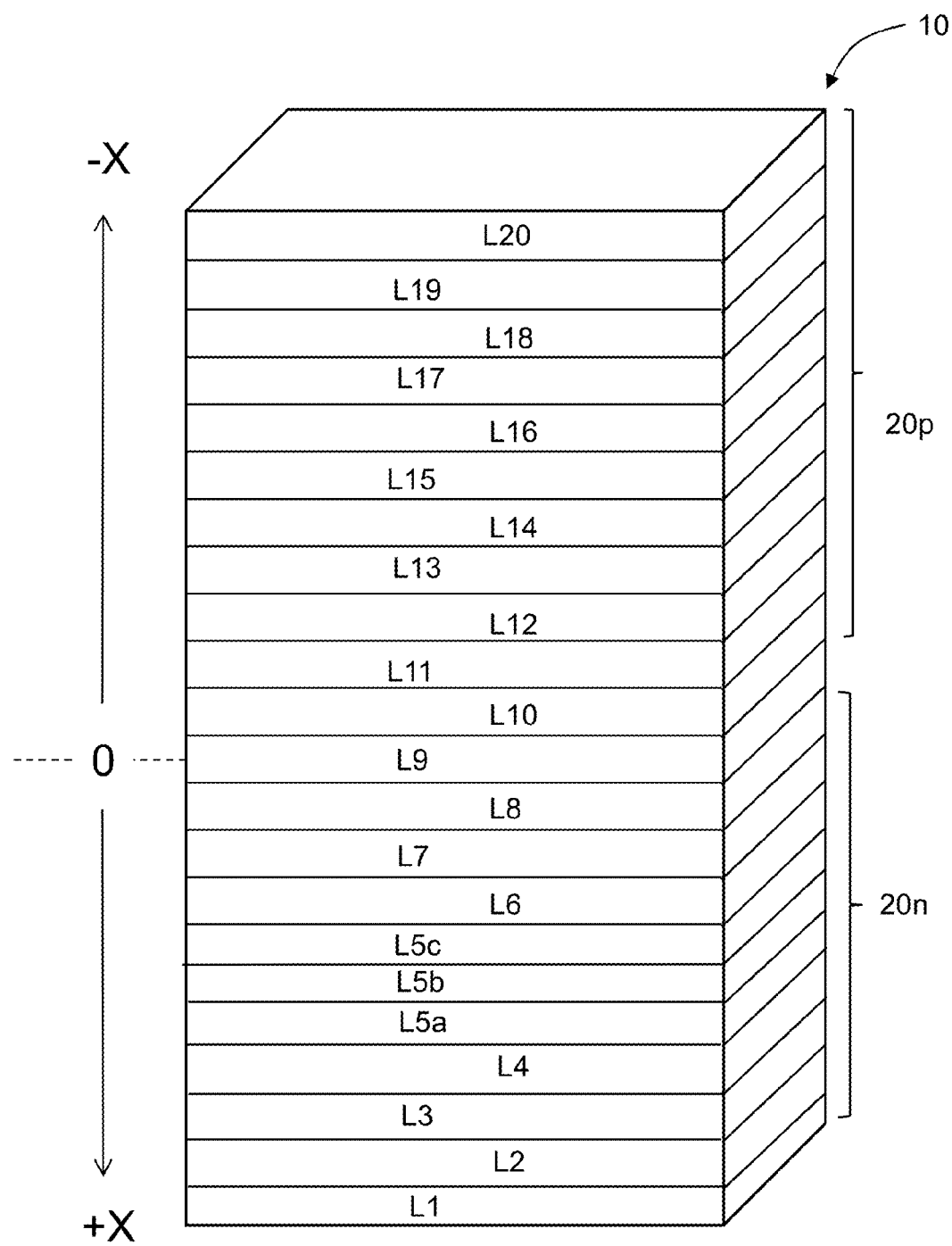
FIGS. 2C and 2D are schematic diagrams of an example of the layered structure of an example DBR GRINSCH laser.

Table 3 sets forth example parameters for an embodiment of FP GRINSCH laser 10 of FIG. 1A as disclosed herein. FIG. 2C is a schematic diagram similar to FIG. 2A that shows the layered structure of the FP GRINSCH laser 10 of Table 3. The parameter T associated with layer L4 is a thickness parameter and can have the value of 0.5, 1, 1.5 or 2 μm.

TABLE 3

FP GRINSCH LASER PARAMETERS

| LAYER | DESCRIPTION | TH | DOPING (cm$^{-3}$) |
|---|---|---|---|
| L20 | p contact: P$^{++}$-GaAs | 50 nm | $1.1 \times 10^{20}$ |
| L19 | p$^+$-GaAs | 50 nm | $(1 \rightarrow 11) \times 10^{19}$ |
| L18 | p$^+$-Al$_{0.28}$GaAs $\rightarrow$ P$^+$-GaAs | 50 nm | $(1 \rightarrow 10) \times 10^{18}$ |
| L17 | p$^+$-Al$_{0.28}$GaAs | 800 nm | $8 \times 10^{17}$ |
| L16 | p$^+$-Al$_{0.28}$GaAs | 300 nm | $(5/3 \rightarrow 8/3) \times 10^{17}$ |
| L15 | p+-Al$_{0.6}$Ga$_{0.4}$As | 5 nm | $10 \times 10^{17}$ |
| L14 | p-Al$_{0.28}$GaAs | 350 nm | $(1 \rightarrow 5/3) \times 10^{17}$ |
| L13 | p$^+$-Al$_{0.28}$GaAs | 5 nm | $1 \times 10^{17}$ |
| L12 | p-Al$_{0.28}$GaAs | 45 nm | $2/3 \times 10^{17}$ |
| L11 | p-Al$_{0.15}$GaAs $\rightarrow$ p-Al$_{0.28}$GaAs | 45.5 nm | $(0.5/3 \rightarrow 2/3) \times 10^{17}$ |
| L10 | Al$_{0.08}$GaAs $\rightarrow$ Al$_{0.15}$GaAs | 24.5 nm | |
| L9 | IN$_{.18}$Ga$_{.72}$As | 7.5 nm | |
| L8 | Al$_{0.15}$GaAs $\rightarrow$ Al$_{0.08}$GaAs | 147 nm | |
| L7 | n-Al$_{0.28}$GaAs $\rightarrow$ n-Al$_{0.15}$GaAs | 273 nm | $5/3 \times 10^{16}$ |
| L6 | n-Al$_{0.28}$GaAs | 90 nm | $4/3 \times 10^{17}$ |
| L5c | n$^+$-Al$_{0.21}$GaAs $\rightarrow$ n$^+$-Al$_{0.28}$GaAs | 20 nm | $4/3 \times 10^{17}$ |
| L5b | n$^+$-Al$_{0.21}$GaAs | T μm-20 nm | $(4 \rightarrow 4/3) \times 10^{17}$ |
| L5a | n$^+$-Al$_{0.28}$GaAs $\rightarrow$ n$^+$-Al$_{0.21}$GaAs | 20 nm | $4 \times 10^{17}$ |
| L4 | n$^+$-Al$_{0.28}$GaAs | (5-T) μm-20 nm | $4 \times 10^{17}$ |
| L3 | n$^+$-GaAs $\rightarrow$ n$^+$-Al$_{0.28}$GaAs | 150 nm | $(3 \rightarrow 1) \times 10^{18}$ |
| L2 | n$^+$-GaAs | 750 nm | $3 \times 10^{18}$ |
| L1 | N metal Contact: n$^+$-GaAs | | |

Layers L6 and L14 have photoluminescent center wavelengths $\lambda_{PL}$ of 700 nm, while lasing layer L9 has a photoluminescent center wavelength of 960 nm.

Figure 4A:
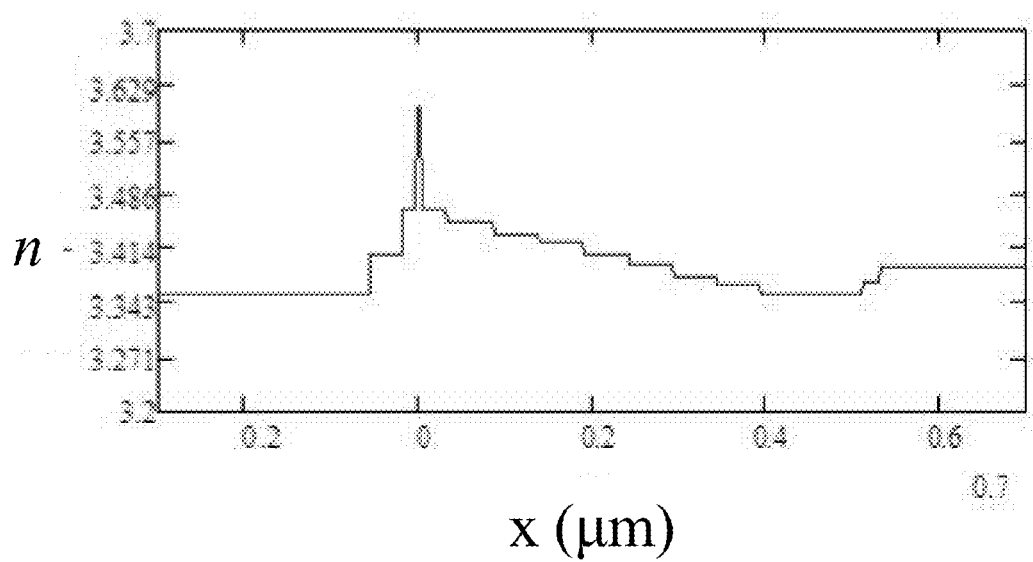
FIG. 4A is a plot of the refractive index n versus the position x (μm) for the FP GRINSCH laser as set forth in Table 3.
Figure 4B:
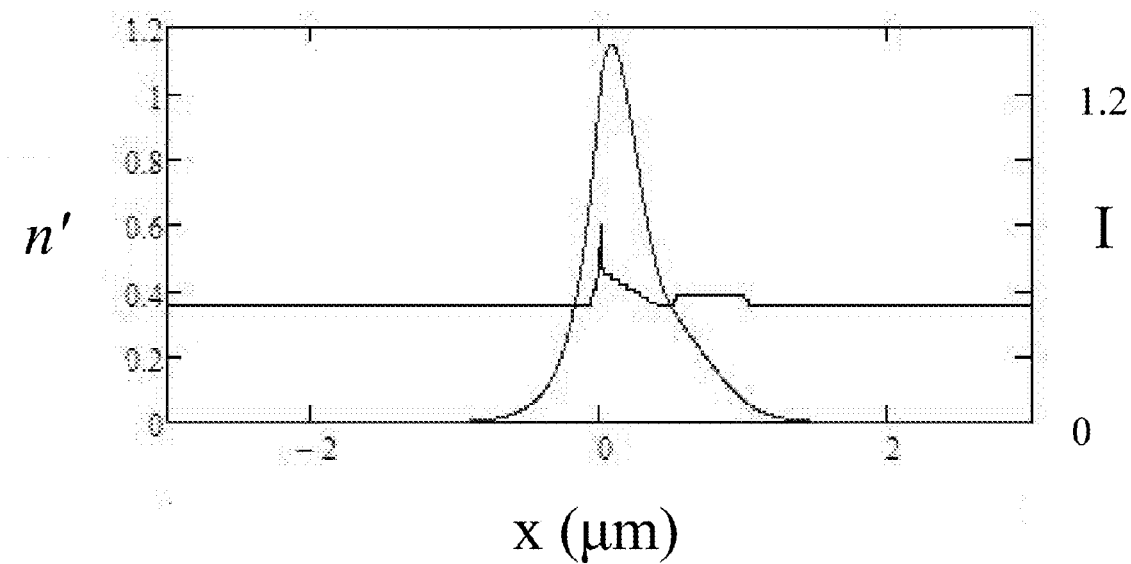
FIG. 4B is a plot of the adjusted refractive index n' and the intensity distribution of the laser beam as a function of position x (μm) for the FP GRINSCH laser as set forth in Table 3.

FIGS. 4A and 4B are the same type of plots as FIGS. 3A and 3B except that they are for the FP GRINSCH laser 10 as set forth in Table 3. The step-wise profile of the refractive index plots of FIGS. 3A and 3B is a quantized approximation used in the modeling calculations, and in actuality the curve is generally continuous.

The configuration of FP GRINSCH laser 10 is asymmetrical about lasing layer L9 and has a reduced doping structure. Asymmetrical GRINSCH laser 10 of Table 3 is modified from the symmetrical GRINSCH laser of Table 2 by half the p-GRINSCH and triple the n-GRINSCH, with the result that more light 40 is confined to n-section 20n (i.e., mostly in the low doped n-GRINSCH section) than in p-section 20p (i.e., the p-GRINSCH section). Moreover, in an example, the amount of doping in the n-GRINSCH section is reduced by a factor of three relative to the prior art GRINSCH laser. Both of these modifications substantially reduce the waveguide loss and result in improved laser efficiency as compared to the GRINSCH laser of Table 2.

An example of the FP GRINSCH laser 10 as disclosed herein emits laser light 40 at a wavelength λ=976 nm over a broad area with a beam power of 11.4 W at a 12 A bias current at a temperature of 20° C. In an example, the temperature of DBR GRINSCH laser 10 is established via a heat sink (not shown).

Figure 5A:
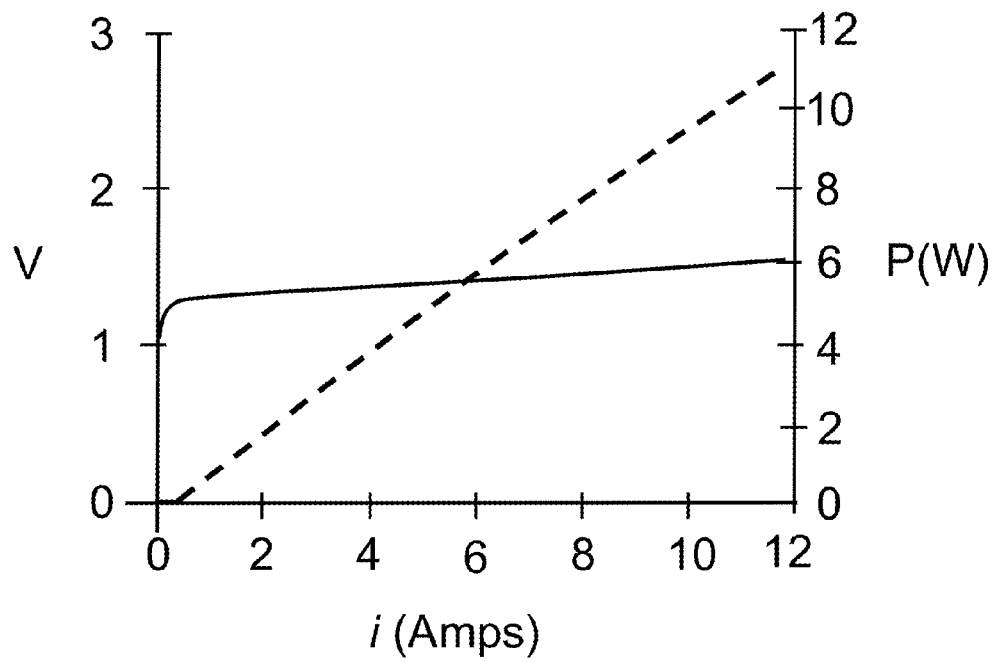
FIG. 5A is a plot of the voltage V (volts V) (solid line) and laser output power P (Watts W) (dashed line) versus the current i (Amperes or "Amps") for the FP GRINSCH laser of Table 3.

FIG. 5A is a plot of the voltage V (volts V) (solid line) and laser output power P (Watts W) (dashed line) versus the bias current i (Amperes or "Amps") for the FP GRINSCH laser of Table 3 with T=0.5.

Figure 5B:
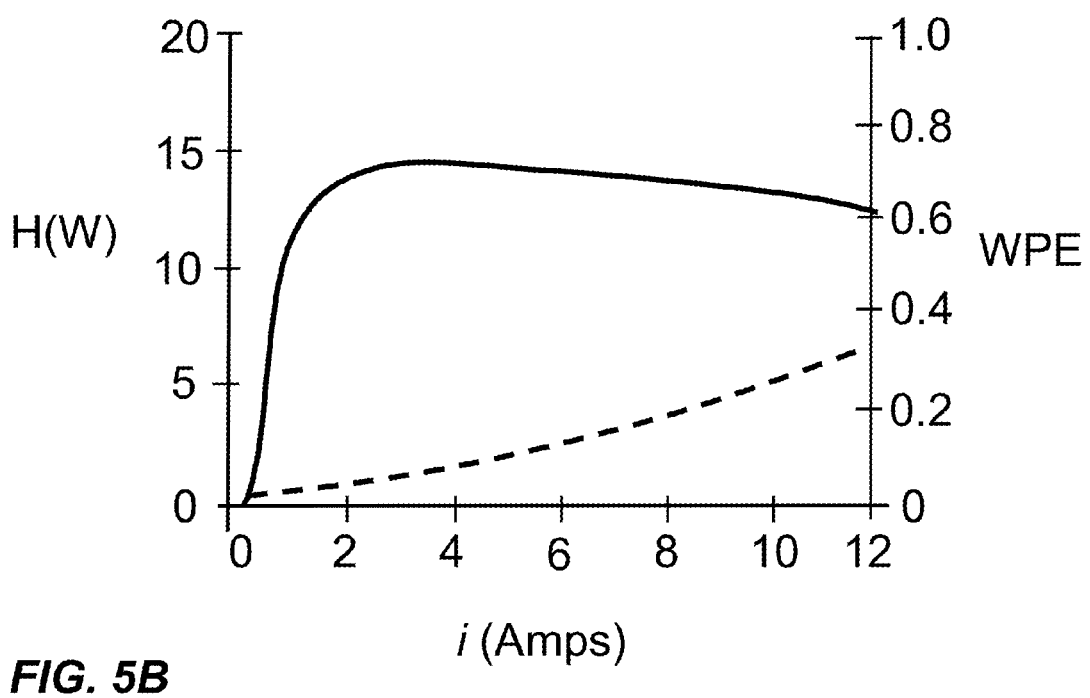
FIG. 5B is a plot of the heat H (W) (solid line) and wall plug efficiency WPE (unitless) (dashed line) versus the current i (Amps) for the FP GRINSCH laser of Table 3.

FIG. 5B is a plot of the heat H (W) (solid line) and wall plug efficiency WPE (unitless) (dashed line) versus the bias current i (Amps) for the FP GRINSCH laser of Table 3 with T=0.5.

Figure 5C:
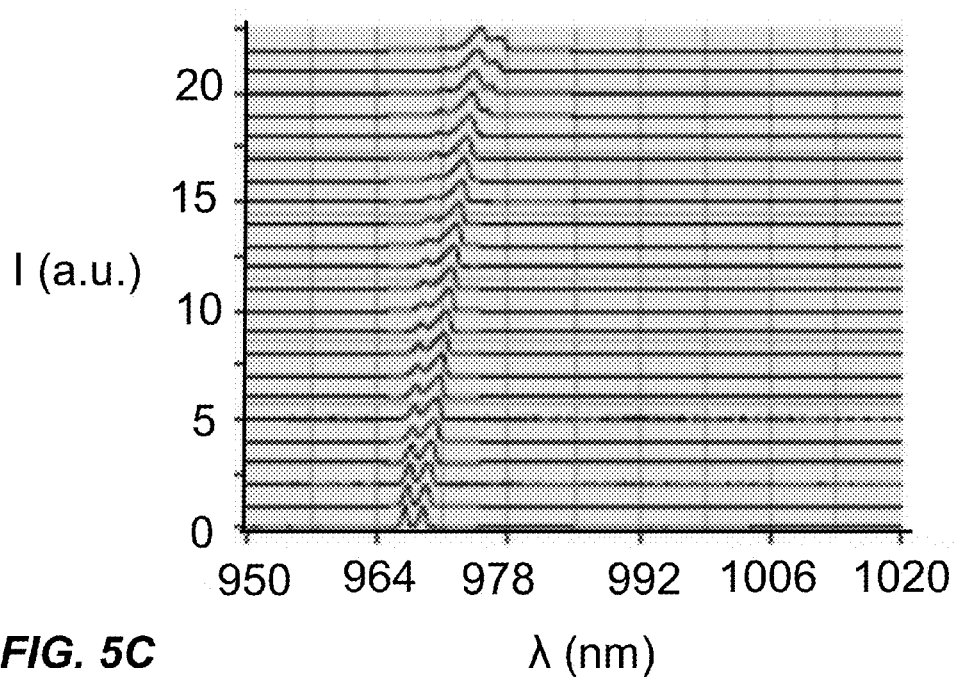
FIG. 5C plots the laser intensity I (arbitrary units, a.u.) versus the lasing wavelength λ (nm) for different bias currents (0.5 A to 12 A at 0.5 A per step) for the FP GRINSCH laser of Table 3.

FIG. 5C plots the laser intensity I (arbitrary units, a.u.) versus the lasing wavelength λ (nm) for different values of the bias current i (Amps) for the FP GRINSCH laser of Table 3 with T=0.5.

Figure 5D:
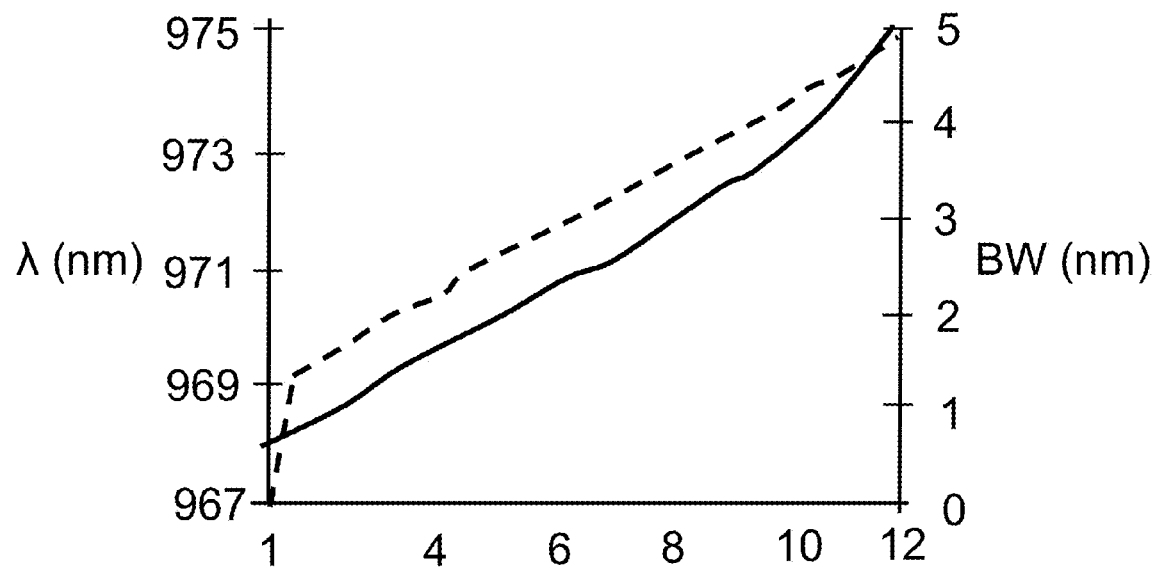
FIG. 5D is a plot of the lasing wavelength λ (nm) (solid line) and the lasing spectral width BW (nm) (dashed line) as a function of current i (Amps) for the FP GRINSCH laser of Table 3.

FIG. 5D is a plot of the lasing wavelength λ (nm) (solid line) and the lasing spectral width BW (nm) (dashed line) as a function of the bias current i (Amps) for the FP GRINSCH laser of Table 3 with T=0.5.

DBR GRINSCH Laser

Figure 2D:
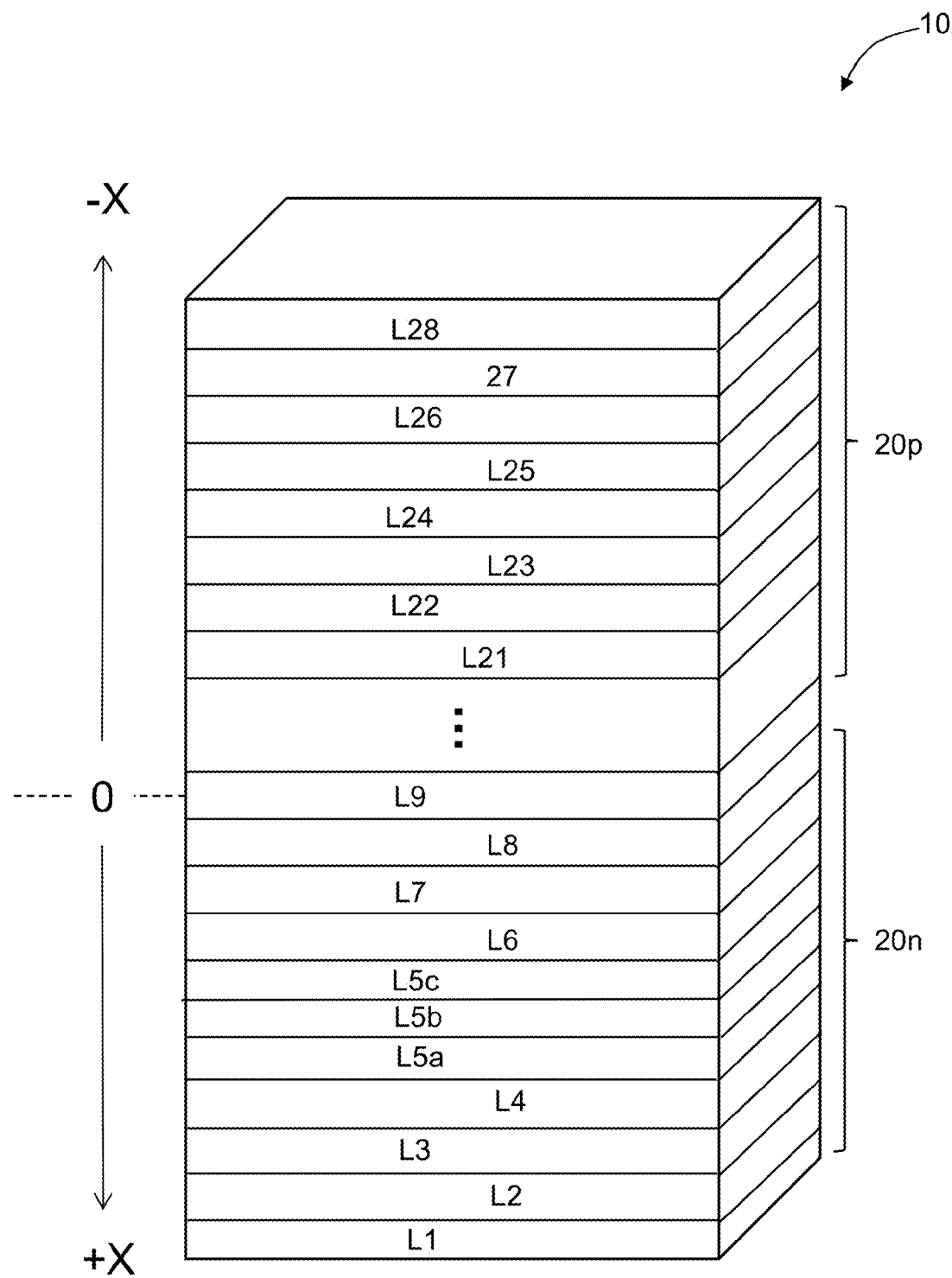

Tables 4A and 4B set forth example parameters for an embodiment of DBR GRINSCH laser 10 of FIG. 1B. FIG. 2D is representative of the layered structure of the FP GRINSCH laser 10 of Tables 4A and 4B. DBR GRINSCH laser 10 is formed using two growth steps, with the first growth step presented in Table 4A and the second growth step presented in Table 4B.

TABLE 4A

DBR GRINSCH LASER PARAMETERS - FIRST STEP

| LAYER | DESCRIPTION | TH | DOPING (cm$^{-3}$) |
|---|---|---|---|
| L20 | Protection layer: p-GaAs | 50 nm | $10 \times 10^{17}$ |
| L19 | p$^+$-GaInP: grating mask etch layer | 25 nm | $10 \times 10^{17}$ |
| L18 | p$^+$-GaAs | 10 nm | $10 \times 10^{17}$ |
| L17 | p$^+$-GaAs: grating layer | 80 nm | $3 \times 10^{17}$ |
| L16 | p$^+$-GaAs | 10 nm | $10 \times 10^{17}$ |
| L15 | p$^+$-GaInP: first grating etch stop layer | 25 nm | $10 \times 10^{17}$ |
| L14 | p$^+$-GaAs second grating etch stop layer | 25 nm | $3 \times 10^{17}$ |
| L13 | p$^+$-Al$_{0.33}$GaAs ($\lambda_{PL}$ = 679 nm) | 5 nm | $3/2 \times 10^{17}$ |
| L12 | p-Al$_{0.33}$GaAs | 45 nm | $1 \times 10^{17}$ |
| L11 | p-Al$_{0.20}$GaAs → p-Al$_{0.33}$GaAs | 45.5 nm | $0.5/2 \rightarrow 2/2) \times 10^{17}$ |
| L10 | Al$_{0.13}$GaAs → Al$_{0.20}$GaAs | 24.5 nm | |
| L9 | In$_{.18}$Ga$_{.72}$As ($\lambda_{PL}$ = 960 nm) | 7.5 nm | |
| L8 | Al$_{0.15}$GaAs → Al$_{0.08}$GaAs | 147 nm | |
| L7 | n-Al$_{0.28}$GaAs → n-Al$_{0.5}$GaAs | 273 nm | $5/3 \times 10^{16}$ |
| L6 | n-Al$_{0.28}$GaAs ($\lambda_{PL}$ = 700 nm) | 90 nm | $(4/3 \rightarrow 1/3) \times 10^{17}$ |
| L5c | n$^+$-Al$_{0.23}$GaAs → n$^+$-Al$_{0.28}$GaAs | 20 nm | $4/3 \times 10^{17}$ |
| L5b | n$^+$-Al$_{0.23}$GaAs ($\lambda_{PL}$ = 725 nm) | 480 nm | $(4 \rightarrow 4/3) \times 10^{17}$ |
| L5a | n$^+$-Al$_{0.28}$GaAs → n$^+$-Al$_{0.23}$GaAs | 20 nm | $4 \times 10^{17}$ |
| L4 | n$^+$-Al$_{0.28}$GaAs | 4.48 μm | $4 \times 10^{17}$ |
| L3 | n$^+$-GaAs → n$^+$-Al$_{0.28}$GaAs | 150 nm | $3 \rightarrow 1 \times 10^{18}$ |
| L2 | n$^+$-GaAs | 750 nm | $3 \times 10^{18}$ |
| L1 | N metal Contact: n$^+$-GaAs | | |

The structure of DBR GRINSCH laser 10 associated with the re-growth or second growth step is represented in Table 4B, below, and shown in FIG. 2C. The typical values for T1 and T2 are 315 and 300 nm, respectively.

TABLE 4B

DBR GRINSCH LASER PARAMETERS - SECOND STEP

| LAYER | DESCRIPTION | TH | DOPING (cm$^{-3}$) |
|---|---|---|---|
| L28 | p$^{++}$-GaAs | 50 nm | $1.1 \times 10^{20}$ |
| L27 | p$^+$-GaAs | 50 nm | $(1 \rightarrow 11) \times 10^{19}$ |
| L26 | p$^+$-Al$_{0.33}$GaAs → p$^+$-GaAs | 50 nm | $(1 \rightarrow 10) \times 10^{18}$ |
| L25 | p-Al$_{0.33}$GaAs | 0.8 μm | $8 \times 10^{17}$ |
| L24 | p-Al$_{0.33}$GaAs | T2 nm | $(5/2 \rightarrow 8/2) \times 10^{17}$ |
| L23 | p$^+$-Al$_{0.6}$Ga$_{0.4}$As | 5 nm | $10 \times 10^{17}$ |
| L22 | p-Al$_{0.33}$GaAs ($\lambda_{PL}$ = 679 nm) | T1 nm | $(3/2 \rightarrow 5/2) \times 10^{17}$ |
| L21 | p-Al$_{0.33}$GaAs | 10 nm | $10 \times 10^{17}$ |

Figure 6A:
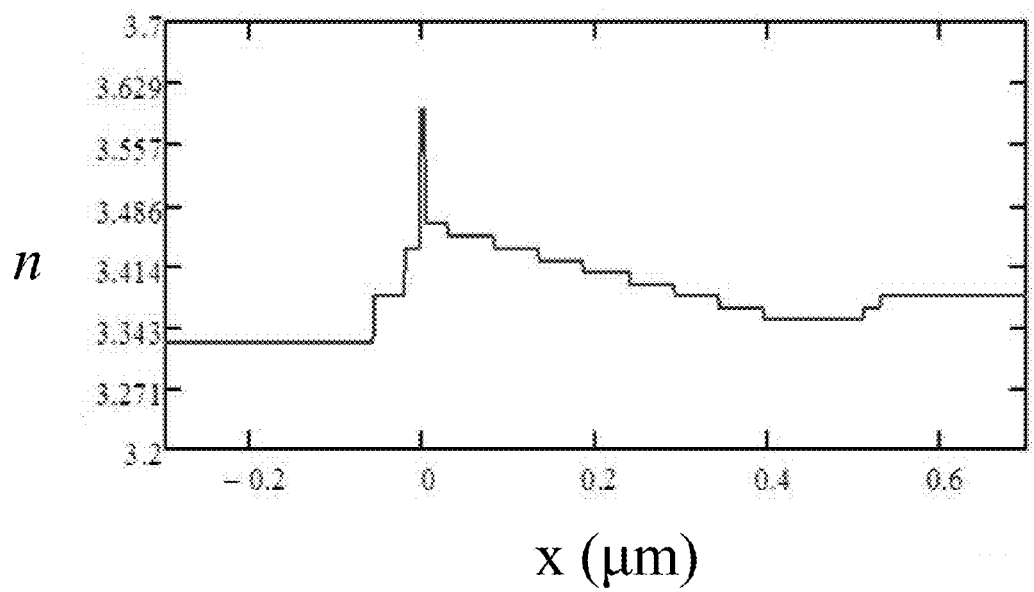
FIG. 6A is a plot of the refractive index n versus the position x (μm) for the DRB GRINSCH laser as set forth in Tables 4A and 4B.
Figure 6B:
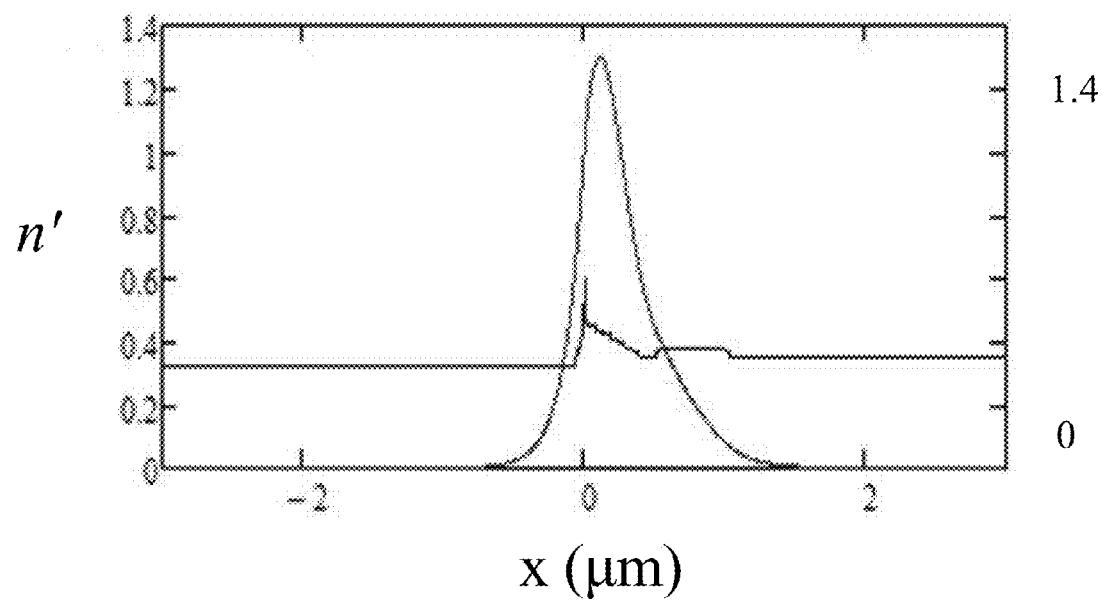
FIG. 6B is a plot of the adjusted refractive index n' and the intensity distribution of the laser beam as a function of position x (μm) for the DBR GRINSCH laser as set forth in Tables 4A and 4B.

FIGS. 6A and 6B are the same type of plots as FIGS. 4A and 4B, except that they are for the DBR GRINSCH laser 10 as set forth in Tables 4A and 4B. The DBR GRINSCH laser 10 as described in Tables 4A and 4B define an asymmetrical GRINSCH configuration with reduced doping and high barrier structure. The aluminum content in the barrier section (layer L10) in p-section 20p is increased from 8% to 13% (relative to the prior art configuration of Table 2) to prevent electron overflow from the quantum well (layer L9) at high temperature. This improves the linearity of the light-current curve at high current, which allows the DBR GRINSCH laser 10 to emit a high-power laser beam 40.

An example of the broad area DBR GRINSCH laser 10 as disclosed herein emits laser light 40 at a wavelength λ=976 with a power of 10 W at a 12 A bias current at a temperature of 20° C. In an example, the temperature of DBR GRINSCH laser 10 is established via a heat sink (not shown).

Figure 7A:
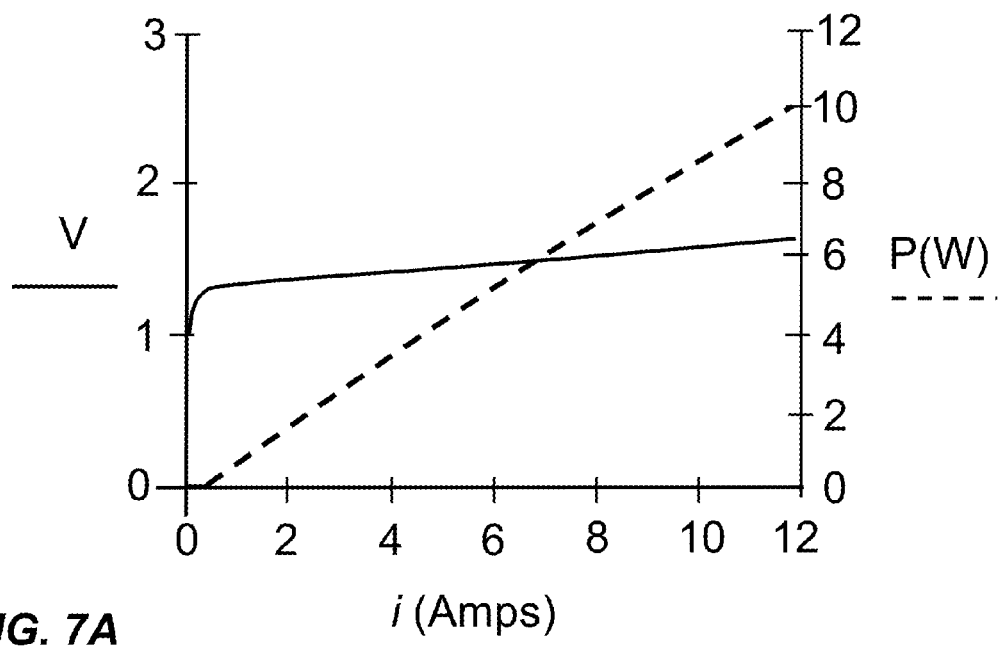
FIG. 7A is a plot of the voltage V (volts V) (solid line) and laser output power P (Watts W) (dashed line) versus the current i (Amps) for the DRB GRINSCH laser of Tables 4A and 4B.

FIG. 7A is a plot of the voltage V (volts V) (solid line) and laser output power P (Watts W) (dashed line) versus the bias current i (Amps A) for the DRB GRINSCH laser of Tables 4A and 4B.

Figure 7B:
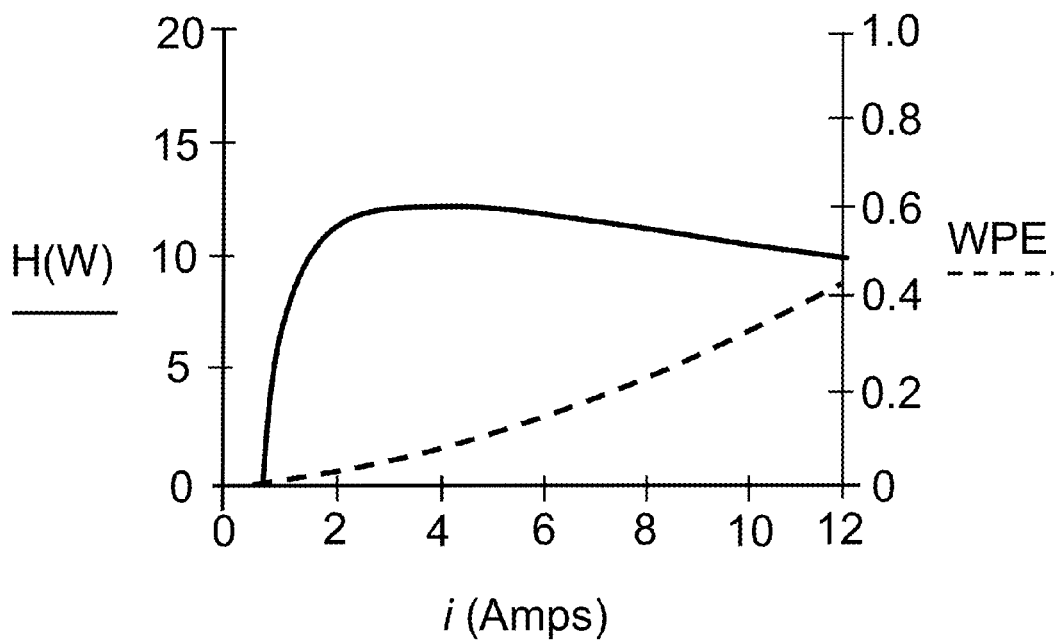
FIG. 7B is a plot of the heat H (W) (solid line) and wall plug efficiency WPE (unitless) (dashed line) versus the current i (Amps) for the DRB GRINSCH laser of Tables 4A and 4B.

FIG. 7B is a plot of the heat H (W) (solid line) and wall plug efficiency WPE (unitless) (dashed line) versus the bias current i (Amps) for the DRB GRINSCH laser of Tables 4A and 4B.

Figure 7C:
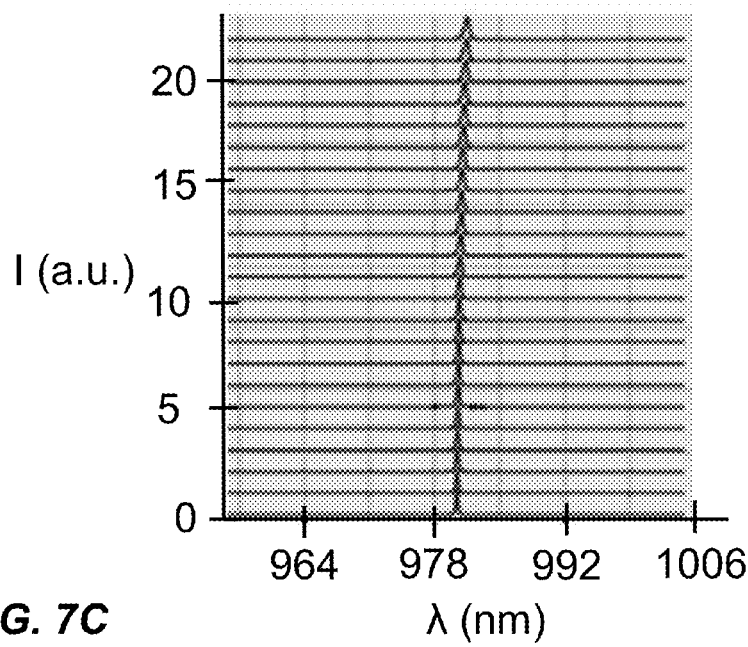
FIG. 7C plots the laser intensity I (arbitrary units, a.u.) versus the lasing wavelength λ (nm) for different values of bias current (0.5-12 A at 0.5 A per step) for the DRB GRINSCH laser of Tables 4A and 4B.

FIG. 7C plots the laser intensity I (arbitrary units) versus the lasing wavelength λ (nm) for different values of the bias current i (Amps) for the DRB GRINSCH laser of Tables 4A and 4B.

Figure 7D:
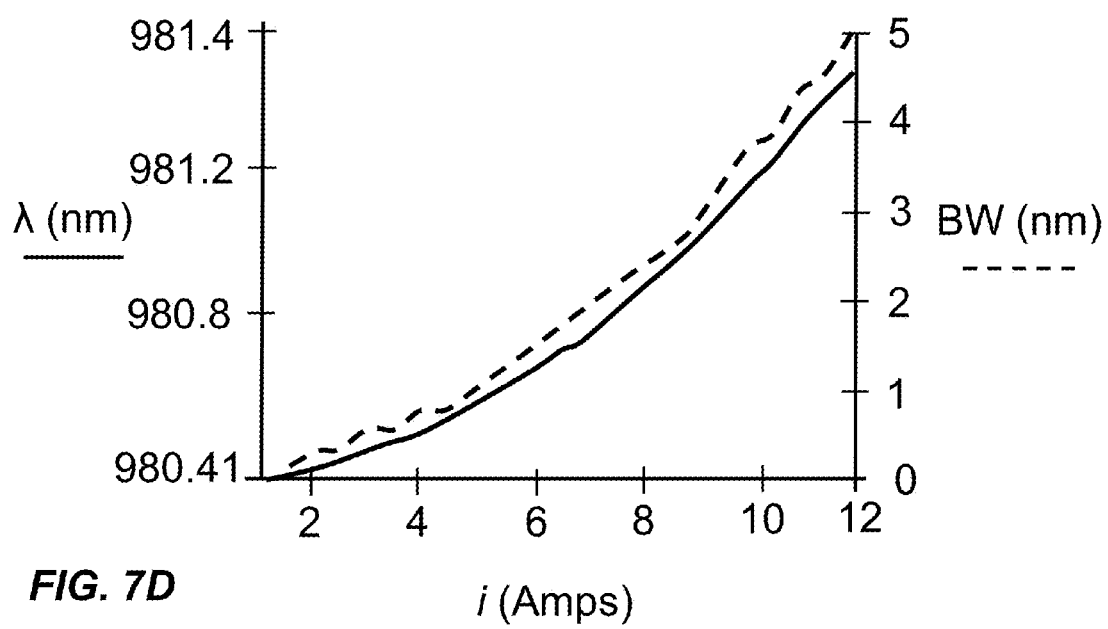
FIG. 7D is a plot of the lasing wavelength λ (nm) (solid line) and the lasing spectral width BW (nm) (dashed line) as a function of current i (Amps) for the DRB GRINSCH laser of Tables 4A and 4B.

FIG. 7D is a plot of the lasing wavelength λ (nm) (solid line) and the lasing width BW (nm) (dashed line) as a function of the bias current i (Amps) for the DRB GRINSCH laser of Tables 4A and 4B.

Example Performance Conditions and Design Parameters

An example GRINSCH laser 10 preferably satisfies a number of performance conditions. A low threshold current i requires quantum well optical confinement factor (QWCF) to be greater than 1% for a laser cavity that is longer than 4 mm. In addition, high coupling efficiency to an optical fiber requires vertical far field angles VFFA (measured at full-width half-maximum) to be less than 30 degrees.

Furthermore, a high slope efficiency SE (i.e., low optical loss) requires an optical confinement factor in n-section 20n to be greater than 60%. High-temperature performance requires the aluminum mole fraction of the QW barrier layers to be 8% or higher.

FIGS. 8A through 8F and FIGS. 9A through 9F are plots associated with a sensitivity studies of the design parameters for an FP or DBR GRINSCH laser 10 having the above properties. These plots define the design space for example GRINSCH lasers 10.

Figure 8A:
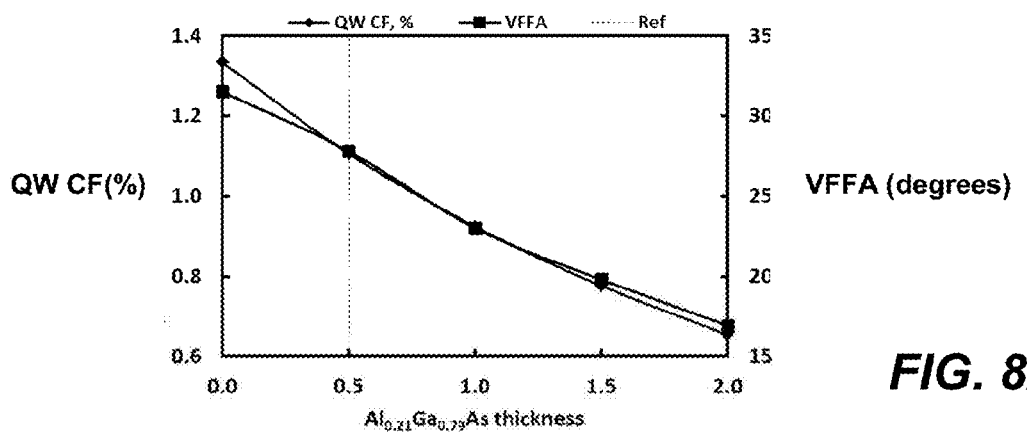
FIGS. 8A through 8F and FIGS. 9A through 9F are plots associated with a sensitivity studies of the design parameters for an FP or a DBR GRINSCH laser having select design properties.
Figure 8B:
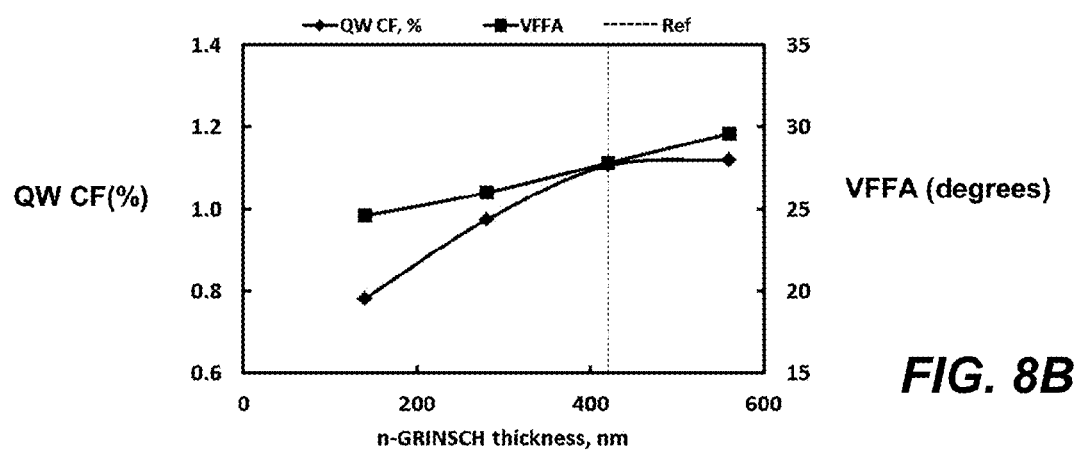
Figure 9A:
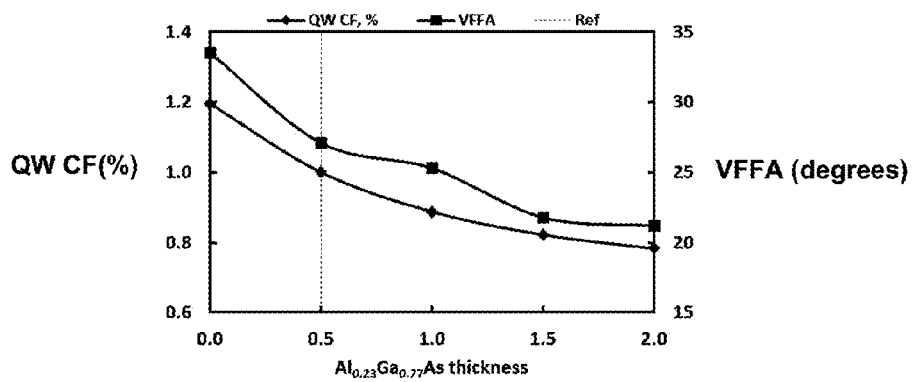
Figure 9B:
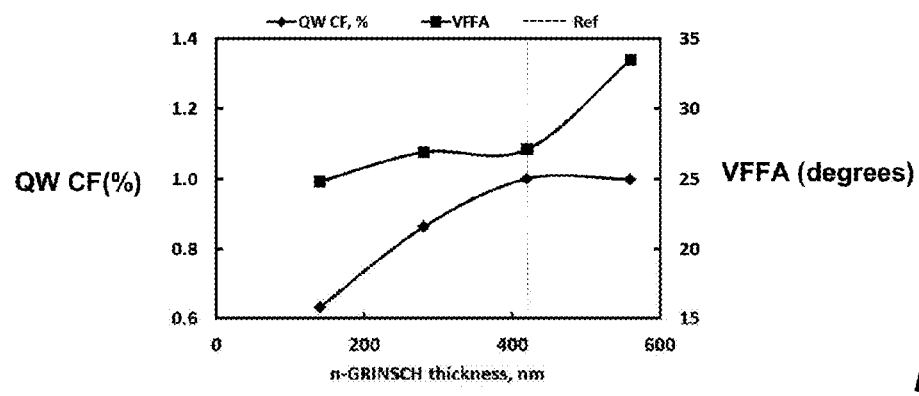

FIGS. 8A and 9A plot the quantum well optical confinement factor QW CF (%) (left vertical axis; diamonds) and the vertical far-field angle VFFA (degrees)(right vertical axis; squares) vs. the sub-cladding layer thickness (microns) of the Al$_{0.21}$Ga$_{0.79}$As and Al$_{0.23}$Ga$_{0.77}$As layers, respectively (see, e.g., FIG. 1B and layers 13NSC and 13PSC). FIGS. 8B and 9B plot the quantum well optical confinement factor QWCF (%) (left vertical axis; diamonds) and the vertical far-field angle VFFA (degrees)(right vertical axis; squares) vs. the thickness (nm) of the n-GRINSCH section 20n.

Figure 8C:
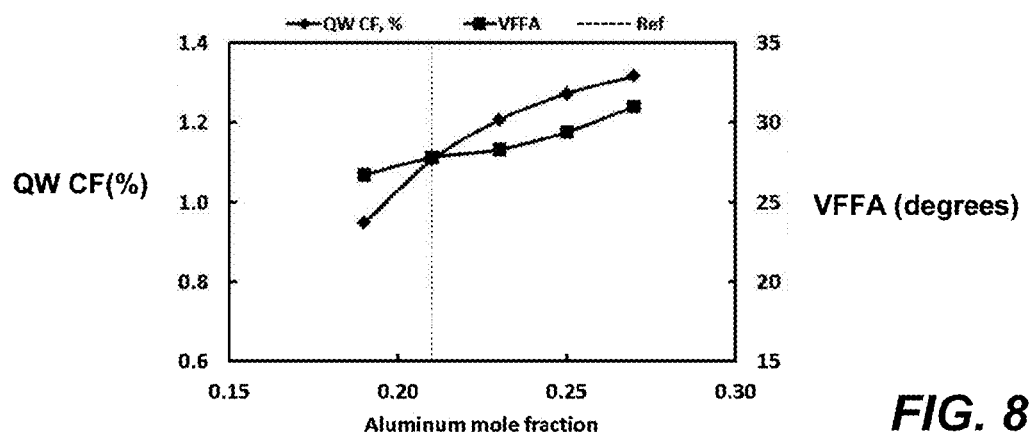
Figure 9C:
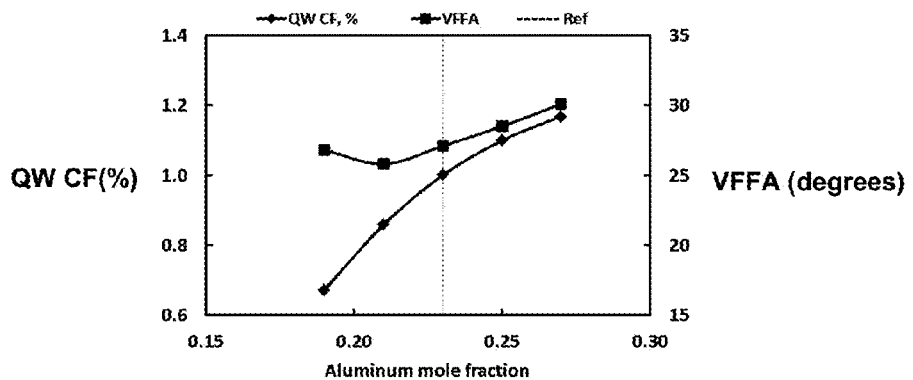

FIGS. 8C and 9C plot the quantum well optical confinement factor QWCF (%) (left vertical axis; diamonds) and the vertical far-field angle VFFA (degrees)(right vertical axis; squares) vs. the aluminum mole fraction of the sub-cladding layers (see, e.g., layers L5b in Table 3 and 4A).

Figure 8D:
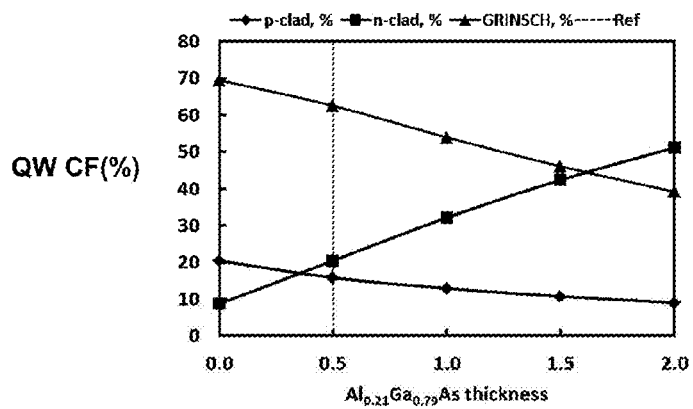
Figure 9D:
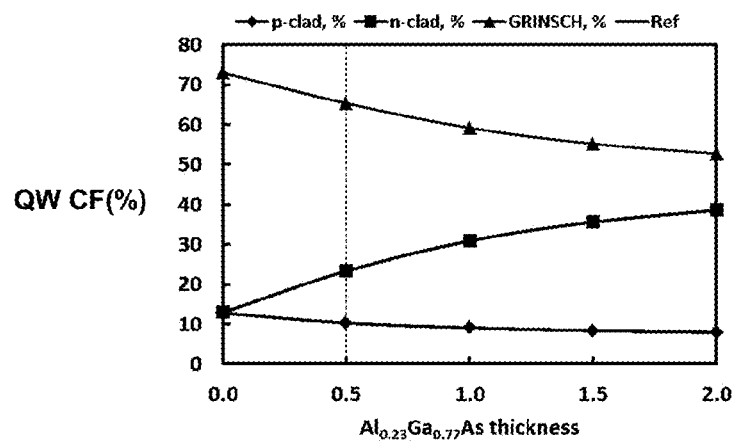

FIGS. 8D and 9D plot the optical confinement factor (%) vs. the thickness (nm) of the Al$_{0.21}$Ga$_{0.79}$As layer and Al$_{0.23}$Ga$_{0.77}$As sub-cladding layers 13PSC and 13NSC, respectively, for the p-cladding layer 13PC (diamonds), the n-cladding layer 13NC (squares) and the n-GRINSCH region (triangles).

Figure 8E:
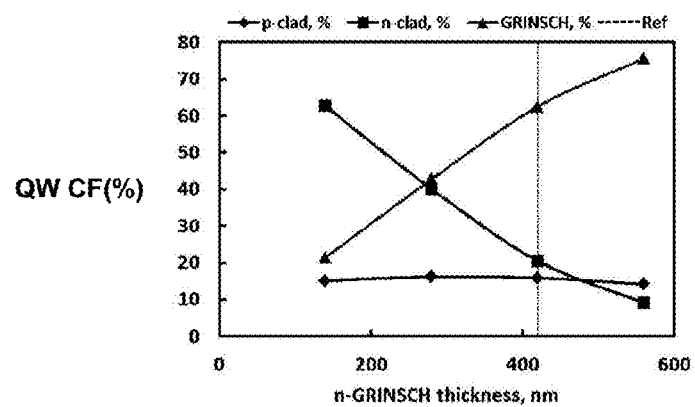
Figure 8F:
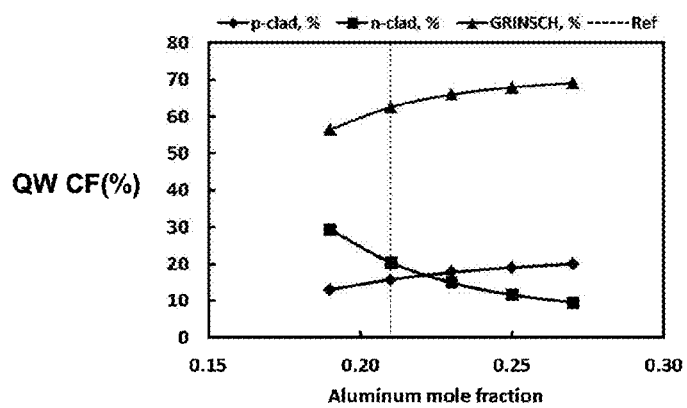
Figure 9E:
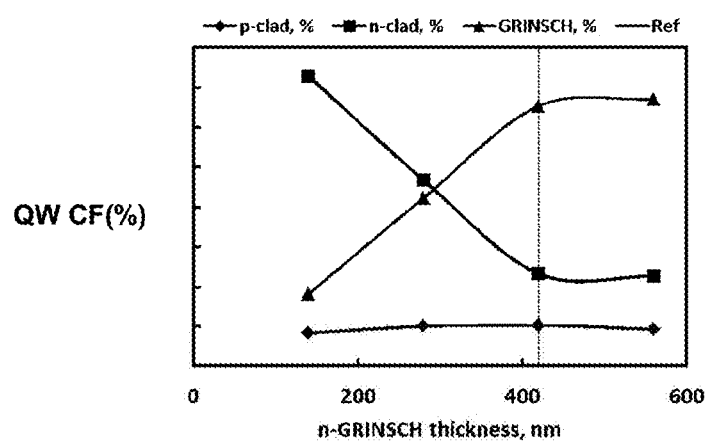
Figure 9F:
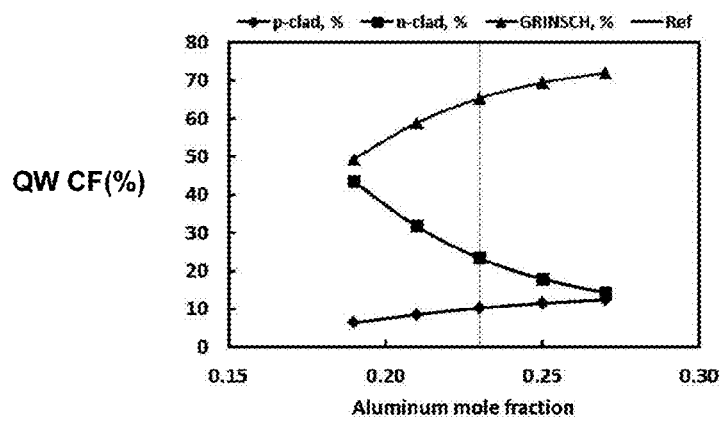

FIGS. 8E and 9E plot the optical confinement factor (%) vs. the n-GRINSCH thickness (nm), along with a dotted vertical reference line indicated the example experimentally demonstrated, for the p-cladding layer (diamonds), n-cladding layer (squares) and the n-GRINSCH region (triangles). FIGS. 8F and 9F plot the optical confinement factor (%) vs. the Aluminum mole fraction, for the p-cladding layer (diamonds), n-cladding layer (squares) and the n-GRINSCH region (triangles).

FIGS. 8F and 9F plot the quantum well optical confinement factor QW CF (%) vs. the Aluminum mole fraction, for the p-cladding layer (diamonds), n-cladding layer (squares) and the n-GRINSCH section (triangles).

The dotted line in the plots represents example design values that satisfy the above-identified performance conditions. In one example, the given design parameter can vary by +/−10% from the value indicated by the vertical dotted line, while in another example, the given design parameter can vary by +/−5%.

Although the embodiments herein have been described with reference to particular aspects and features, it is to be understood that these embodiments are merely illustrative of desired principles and applications. It is therefore to be understood that numerous modifications may be made to the illustrative embodiments and that other arrangements may be devised without departing from the spirit and scope of the appended claims.

What is claimed is:

1. A gradient-index separate-confinement heterostructure (GRINSCH) laser that emits light having an output power, comprising:
   a lasing layer comprising a quantum-well structure;
   an n-doped multilayer section having a first thickness T1;
   a p-doped multilayer section having second thickness T2;
   wherein the p-doped and n-doped multilayer sections sandwich the lasing layer;
   a p-cladding layer and a p-contact layer disposed adjacent the p-doped multilayer section opposite the laser layer;
   a n-cladding layer and a n-contact layer disposed adjacent the n-doped multilayer section opposite the laser layer; and
   wherein the first and second thicknesses T1 and T2 define a thickness ratio $R_T=T1/T2$, wherein $2 \leq R_T \leq 8$, wherein greater than 60% of the light is confined to the n-doped multilayer section as compared to the p-doped multilayer section, and wherein the output power is between 4 W and 11.4 W.

2. The GRINSCH laser of claim 1, wherein $5.5 \leq R_T \leq 6.5$.

3. The GRINSCH laser according to claim 1, wherein T1 is in the range: 350 nm $\leq$ T1 $\leq$ 650 nm.

4. The GRINSCH laser according to claim 3, wherein T1 is in the range: 400 nm $\leq$ T1 $\leq$ 600 nm.

5. The GRINSCH laser according to claim 1, wherein the n-doped multilayer section and the p-doped multilayer section each has a doping level of no greater than $1 \times 10^{17}/cm^3$.

6. The GRINSCH laser according to claim 5, wherein the n-doped multilayer section and the p-doped multilayer section each has a doping level of no greater than $1 \times 10^{16}/cm^3$.

7. The GRINSCH laser according to claim 1, further comprising a confinement factor of greater than 1%.

8. The GRINSCH laser according to claim 7, further comprising a vertical far-field angle of less than 30 degrees.

9. The GRINSCH laser according to claim 7, further comprising an AlGaAs sub-cladding layer having a thickness in the range between 0.25 micron and 0.75 micron.

10. The GRINSCH laser according to claim 9, wherein the sub-cladding layer thickness is in the range between 0.25 micron and 0.6 micron.

11. The GRINSCH laser according to claim 9, wherein AlGaAs sub-cladding layer has an atom fraction of Aluminum in the range from 0.20 to 0.26.

12. The GRINSCH laser according to claim 1, further comprising a quantum well barrier layer that resides between the lasing layer and the p-doped multilayer section, wherein the quantum well barrier layer contains AlGaAs with an atom fraction of Aluminum in the range from 6% to 13%.

13. The GRINSCH laser according to claim 12, wherein the atom fraction of Aluminum is in the range from 8% to 13%.

14. The GRINSCH laser of claim 1 wherein the emitted beam power of 11.4 W is at a 12 A bias current and a 20° C. heat sink temperature.

15. The GRINSCH laser of claim 1 having a laser cavity that is longer than 4 mm.

16. The GRINSCH laser of claim 1, wherein the output power is between 6 W and 11.4 W.

17. A gradient-index separate-confinement hetero structure (GRINSCH) laser that emits a laser beam with an emitted beam power, comprising:
   a lasing layer comprising a quantum-well structure;
   an n-doped multilayer section having a first thickness T1;
   a p-doped multilayer section having second thickness T2;
   wherein the p-doped and n-doped multilayer sections sandwich the lasing layer;
   a p-cladding layer and a p-contact layer disposed adjacent the p-doped multilayer section opposite the laser layer;
   a n-cladding layer and a n-contact layer disposed adjacent the n-doped multilayer section opposite the laser layer; and
   wherein the first and second thicknesses T1 and T2 define a thickness ratio $R_T=T1/T2$, wherein $2 \leq R_T \leq 8$; and
   wherein the emitted beam power is 11.4 W at a 12 A bias current and a 20° C. heat sink temperature.

* * * * *